United States Patent [19]
O'Boyle

[11] Patent Number: 5,883,522
[45] Date of Patent: Mar. 16, 1999

[54] APPARATUS AND METHOD FOR RETAINING A SEMICONDUCTOR WAFER DURING TESTING

[75] Inventor: John O. O'Boyle, Redwood City, Calif.

[73] Assignee: National Semiconductor Corporation, Santa Clara, Calif.

[21] Appl. No.: 744,362

[22] Filed: Nov. 7, 1996

[51] Int. Cl.[6] .............................. B25B 11/00; B65H 9/08; G01R 31/26
[52] U.S. Cl. ......................... 324/765; 324/754; 414/935; 414/941; 269/21; 269/112; 269/903
[58] Field of Search .................................. 324/754, 755, 324/758, 765; 414/935, 941; 269/21, 111, 112, 903

[56] References Cited

U.S. PATENT DOCUMENTS

| | | | |
|---|---|---|---|
| 4,582,191 | 4/1986 | Weigand | 414/941 X |
| 4,860,439 | 8/1989 | Riley | 269/903 X |
| 5,262,029 | 11/1993 | Erskine et al. | 204/298.15 |
| 5,310,306 | 5/1994 | Lunghi | 414/788 |
| 5,316,278 | 5/1994 | Sherstinsky et al. | 269/254 |
| 5,437,757 | 8/1995 | Rice et al. | 156/345 |

Primary Examiner—Glenn W. Brown
Attorney, Agent, or Firm—Limbach & Limbach L.L.P.

[57] ABSTRACT

A retaining apparatus for retaining a semiconductor wafer on the surface of a chuck. The retaining apparatus includes elongate shafts each positioned adjacent to a perimeter of the surface of the chuck and so that a lengthwise axis of each shaft is substantially perpendicular to the surface of the chuck. Two shafts are located on one side of a diameter of the surface of the chuck and two additional shafts are located on another side of the diameter of the surface of the chuck. Retainer members are connected to each of the shafts. The retainer members extend over the surface of the chuck and portions of the semiconductor wafer resting thereon in order to retain the semiconductor wafer thereagainst when the retainer members are in a closed position. Chambers each receive another end of each of the shafts. A vacuum source is coupled to the chambers to provide suction inside the chambers to pull the shafts deeper into their respective chambers so that the retainer members move from an open position where they are spaced apart from the semiconductor wafer to the closed position where they contact portions of the semiconductor wafer. Methods of retaining a semiconductor wafer on a first surface of a chuck and testing a semiconductor wafer are also disclosed.

38 Claims, 6 Drawing Sheets

APPARATUS AND METHOD FOR RETAINING A SEMICONDUCTOR WAFER DURING TESTING

BACKGROUND OF THE INVENTION

1. Field of the Invention

The present invention relates generally to semiconductor wafer testing equipment and methods, and, in particular, to an apparatus and method for retaining a semiconductor wafer on a chuck surface.

2. Description of the Related Art

The manufacturing process of semiconductor wafers generally includes the so called "front end" stage which includes the actual processing of the wafer, and the so called "back end" stage which includes the testing of the completed wafer. During the back end testing operations the wafer is normally secured to the chuck of an automated testing station. A probe card which is attached to a probe card holder is positioned above the wafer and is lowered so that its pins can stick into the wafer to make electrical contact with the pads of the particular chip(s) being tested. It is important that the wafer be tightly held in place so that as the probe card moves, its pins connect to the proper pads of the wafer. If the wafer is permitted to move, even slightly, the probe card's pins may not make contact with the proper pads, thus causing the testing operations to fail and possibly even cause damage to the wafer.

Vacuum chucks have typically been used to hold wafers tightly in place during testing operations. Specifically, a vacuum chuck includes a series of apertures in the surface of the chuck to which a vacuum source is connected. The suction created between the surface of the chuck and the bottom surface of the wafer securely holds the wafer in place.

Vacuum chucks perform very well for solid wafers through which air cannot pass. However, a vacuum chuck will not work well for a wafer having one or more "through holes". This is because a suction force between the surface of the chuck and the bottom surface of the wafer cannot be achieved since the air will continue to pass through the through holes in the wafer.

For example, semiconductor microphones and pressure sensors often include open areas which extend completely through the wafer, as well as very thin and sensitive areas, such as diaphragms. Because the open areas go all the way through the wafer, there is no way to pull a complete vacuum. Furthermore, other problems may arise in trying to use a vacuum chuck with these structures. Specifically, the vacuum may create too much pressure (atmospheric pressure) on the diaphragm and cause it to distend or even break. If the diaphragm distends without breaking it will be stretched to its limits and be unable to vibrate. A diaphragm that cannot vibrate freely in response to pressure waves cannot be properly tested.

Thus, there is a need for an apparatus and method for tightly holding micromachined wafers having through holes and/or sensitive areas in place during back end testing procedures. Furthermore, it would be desirable if such apparatus and method would be capable of being installed on a conventional vacuum chuck.

SUMMARY OF THE INVENTION

The present invention provides an apparatus for retaining a semiconductor wafer on a first surface of a chuck. The apparatus includes a first chamber positioned adjacent to the chuck and disposed below the first surface of the chuck. A first elongate shaft has a first end positioned above the first surface of the chuck and a second end positioned inside the first chamber. A first retainer member is connected to the first end of the first shaft and extends over the first surface of the chuck and a portion of the semiconductor wafer resting thereon in order to retain the semiconductor wafer thereagainst when the first retainer member is in a closed position. A retraction means pulls the first shaft deeper into the first chamber so that the first retainer member moves from an open position where it is spaced apart from the semiconductor wafer to the closed position where it contacts the portion of the semiconductor wafer.

The present invention also provides an apparatus for retaining a semiconductor wafer on a first surface of a chuck. The apparatus includes first and second chambers positioned adjacent to a perimeter of the chuck and disposed below the first surface of the chuck. First and second elongate shafts each have a first end positioned above the first surface of the chuck and a second end positioned inside the first and second chambers, respectively. First and second retainer members are connected to the first ends of the first and second shafts, respectively, and extend over the first surface of the chuck and portions of the semiconductor wafer resting thereon in order to retain the semiconductor wafer thereagainst when the first and second retainer members are in a closed position. A vacuum source is coupled to the first and second chambers to provide suction inside the first and second chambers to pull the first and second shafts deeper into their respective chambers so that the first and second retainer members move from an open position where they are spaced apart from the semiconductor wafer to the closed position where they contact portions of the semiconductor wafer.

The present invention also provides a semiconductor wafer test station. The test station includes a chuck mounted on a base. The chuck has a substantially planar first surface for receiving a wafer. A first block having a first chamber formed therein is positioned adjacent to the chuck and disposed below the first surface of the chuck. A first elongate shaft extends into the first chamber and is positioned so that its lengthwise axis is substantially perpendicular to the first surface of the chuck. The first shaft has a helical thread therearound which engages with a complimentary helical thread formed on an inner surface of the first chamber so that the first shaft rotates about its lengthwise axis as it moves within the first chamber in a direction collinear with its lengthwise axis. A first retainer member is connected to the first shaft at a point such that the first retainer member extends over the first surface of the chuck to sandwich a portion of the wafer therebetween when the first retainer member is in a closed position. A vacuum source is coupled to the first chamber to provide suction inside the first chamber to pull the first shaft deeper into the first chamber so that the first retainer member moves from an open position where it is spaced apart from the first surface of the chuck to the closed position where it contacts a portion of the wafer. The first shaft rotates about its lengthwise axis as it moves from the open position to the closed position.

The present invention also provides a method of retaining a semiconductor wafer on a first surface of a chuck. The method includes the steps of: creating a vacuum inside of a first chamber which is positioned adjacent to the chuck and disposed below the first surface of the chuck; using the vacuum created inside of the first chamber to pull a first elongate shaft deeper into the first chamber, the first elongate shaft being positioned substantially perpendicular to the first surface of the chuck and having a first end which extends thereabove; and rotating the first shaft about its lengthwise axis as it is pulled deeper into the first chamber so that a first retainer member connected to the first end of the first shaft rotates from an open position where it does not extend over the first surface of the chuck to a closed position where it does extend over the first surface of the chuck.

The present invention also provides a method of testing a semiconductor wafer. The method includes the steps of: placing the semiconductor wafer on a first surface of a chuck; creating a vacuum inside of a first chamber which is positioned adjacent to the chuck and disposed below the first surface of the chuck; using the vacuum created inside of the first chamber to pull a first elongate shaft deeper into the first chamber, the first elongate shaft being positioned substantially perpendicular to the first surface of the chuck and having a first end which extends thereabove; rotating the first shaft about its lengthwise axis in a first direction as it is pulled deeper into the first chamber so that a first retainer member connected to the first end of the first shaft rotates from an open position where it does not extend over the first surface of the chuck to a closed position where it extends over the first surface of the chuck and contacts a portion of the semiconductor wafer to retain it on the first surface of the chuck; probing the semiconductor wafer with a testing apparatus; and moving the first shaft further out of the first chamber so that the first retainer member moves from the closed position to the open position.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
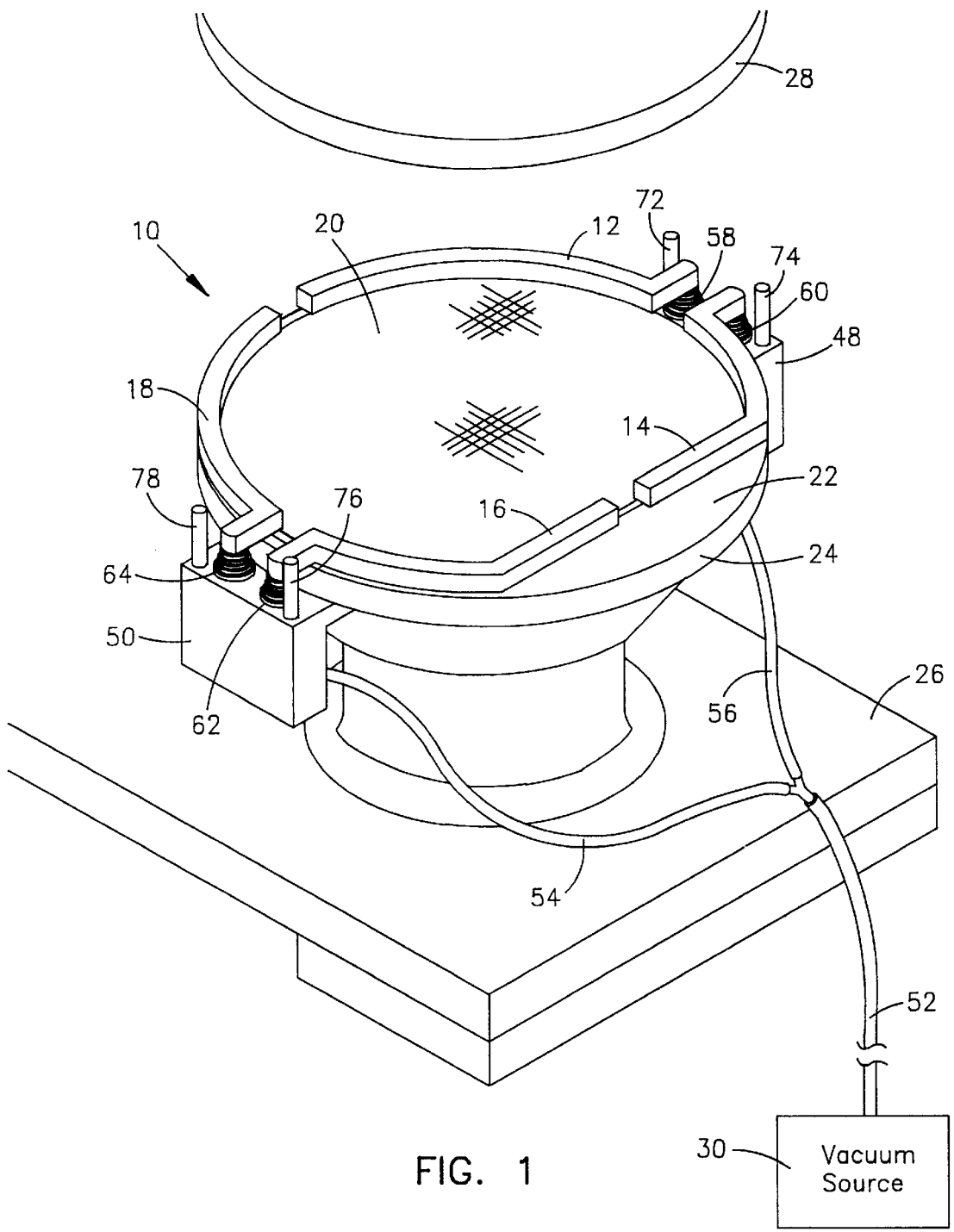
FIG. 1 is a perspective view illustrating a semiconductor wafer retaining apparatus in accordance with the present invention.

Referring to FIG. 1, there is shown a semiconductor wafer retaining apparatus 10 in accordance with the present invention. The retaining apparatus 10 overcomes the disadvantages discussed above of conventional vacuum chucks because it is capable of tightly holding micromachined wafers having through holes and/or sensitive areas during automated wafer testing. Furthermore, the retaining apparatus 10 may be installed on a conventional vacuum chuck.

Figure 2:
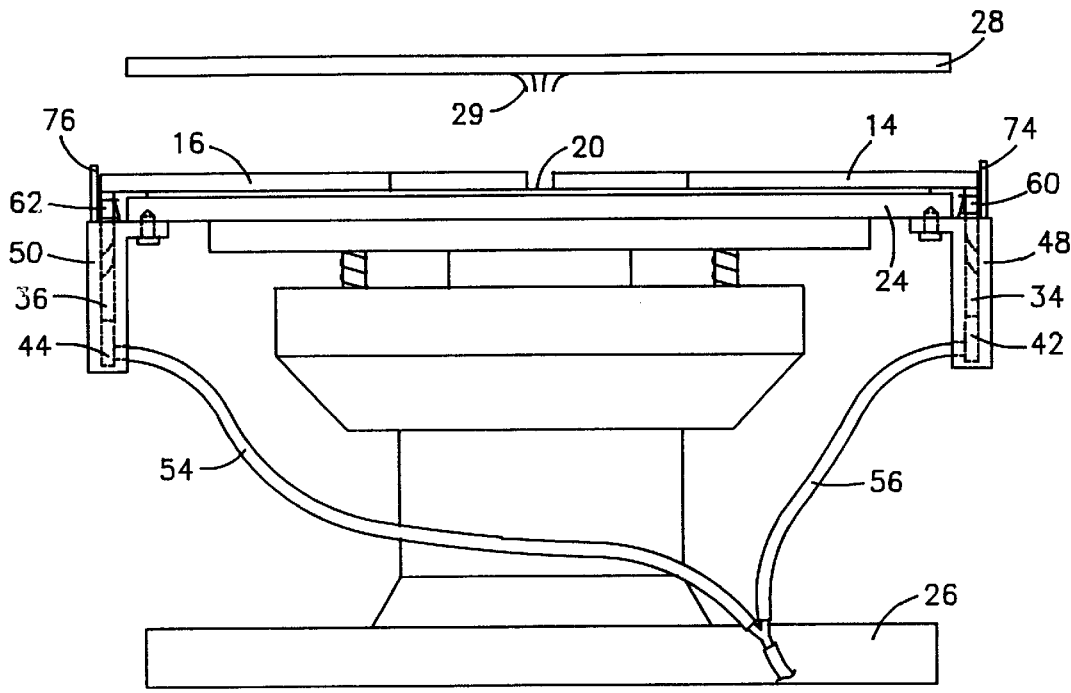
FIG. 2 is a front view illustrating the semiconductor wafer retaining apparatus shown in FIG. 1.
Figure 3:
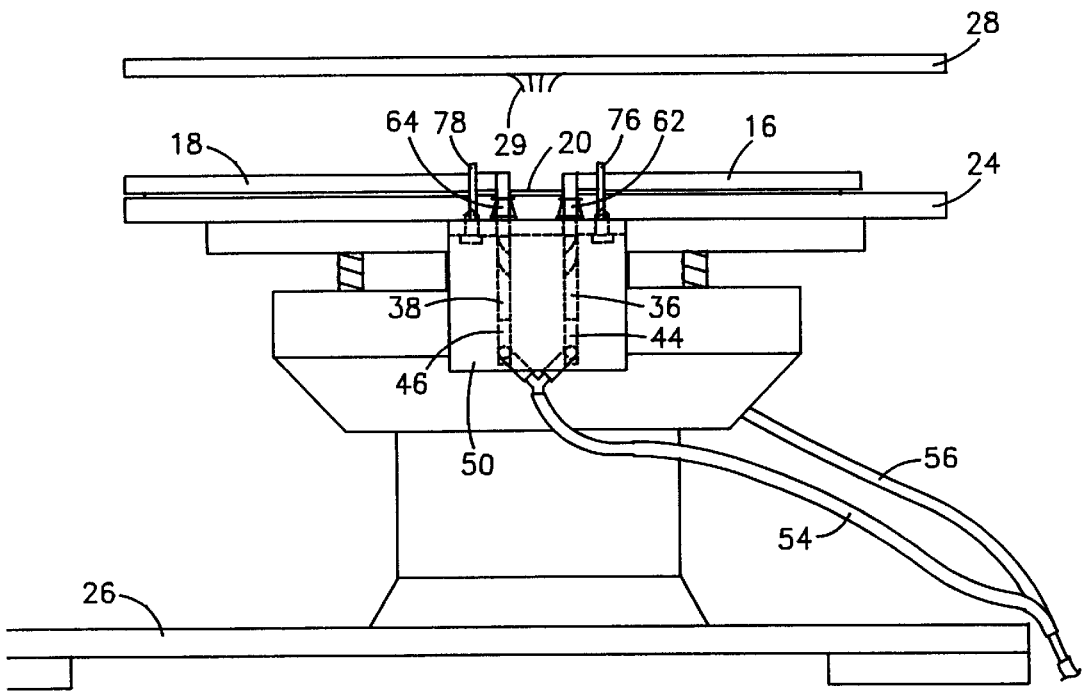
FIG. 3 is a side view illustrating the semiconductor wafer retaining apparatus shown in FIG. 1.

The retaining apparatus 10 is a mechanical device which uses the retaining arms 12, 14, 16, 18 to hold the wafer 20 in place on the surface 22 of the chuck 24. The chuck 24 is typically mounted on a moveable base 26, and a probe card holder 28 is normally positioned above the chuck so that the probe card pins 29 can stick into the wafer 20. The retaining arms 12, 14, 16, 18 serve as mechanical clamps and are arranged around the periphery of the wafer 20. Specifically, FIG. 1 shows the retaining arms 12, 14, 16, 18 in the closed position. In the closed position the retaining arms 12, 14, 16, 18 extend over the surface 22 of the chuck 24, as well as the edge of the wafer 20. Referring to FIGS. 2 and 3, the retaining arms 12, 14, 16, 18 rest on the edge of the wafer 20 in order to clamp, or tightly secure, the wafer 20 between the retaining arms 12, 14, 16, 18 and the surface 22.

The retaining arms 12, 14 are located on opposite sides of a diameter of the surface 22 from the retaining arms 16, 18. The retaining arms 12, 18 are arcuate in shape, while the retaining arms 14, 16 have a straight portion. This is because semiconductor wafers are often not completely circular, but rather, include one straight edge; some semiconductor wafers even include two straight edges oriented at 90° to each other. It should be well understood, however, that the retaining arms 12, 14, 16, 18 may have many different shapes in accordance with the present invention. Furthermore, while four retaining arms 12, 14, 16, 18 are shown in the figures, a greater or fewer number of retaining arms may be used in accordance with the present invention. Typically, the number and shape of the retaining arms used will be such that the retaining arms, when in the closed position, will rest on the edge of the semiconductor wafer, whatever the wafer's shape. It may be desirable that the retaining arms rest on most, or at least a substantial portion, of the edge of the wafer. In this scenario the retaining arms may be curved with the same circumference arc of the wafer. However, it should be well understood that this is not a requirement of the present invention and that it is envisioned that one or more retaining arms could extend over a central portion of the wafer in order to secure it to the chuck surface.

A vacuum source 30 is used to move, i.e., open and close, the retaining arms 12, 14, 16, 18. Specifically, each of the retaining arms 12, 14, 16, 18 is connected to a corresponding elongate shaft 32, 34, 36, 38. Each retaining arm 12, 14, 16, 18 may be connected to its respective shaft 32, 34, 36, 38 via a screw so that the arms are removable from the shafts in the event that an arm becomes bent. Alternatively, each retaining arm 12, 14, 16, 18 may be connected to its respective shaft 32, 34, 36, 38 by means of welding, or the like, or, each retaining arm 12, 14, 16, 18 and its respective shaft 32, 34, 36, 38 may be formed from a single piece of metal or other material so as to form an integral unit.

Each of the shafts 32, 34, 36, 38 is inserted into a corresponding chamber 40, 42, 44, 46. The chambers 40, 42 are formed in a block 48, and the chambers 44, 46 are formed in a block 50. As shown in FIGS. 1–3, the blocks 48, 50 are attached to the lower surface of the chuck 24 so that the chambers 40, 42, 44, 46 are positioned adjacent to the chuck 24 and disposed below the surface 22. Furthermore, the blocks 48, 50 are positioned so that each of the shafts 32, 34, 36, 38 is positioned adjacent to the perimeter of the surface 22 of the chuck 24 and so that the lengthwise axis of each shaft 32, 34, 36, 38 is substantially perpendicular to the surface 22.

The vacuum source 30 is connected to each of the chambers 40, 42, 44, 46 by means of the vacuum hoses 52, 54, 56. Although FIGS. 1–3 show the vacuum hoses 52, 54, 56 being external to the base 26 and the chuck 24, it should be well understood that the vacuum source 30 may be connected to the chambers 40, 42, 44, 46 by means of channels embedded internal to the base 26 and/or chuck 24.

The vacuum source 30 provides suction inside the chambers 40, 42, 44, 46 which pulls the shafts 32, 34, 36, 38 deeper into their respective chamber so that the retaining arms 12, 14, 16, 18 move from an open position to the closed position shown in FIGS. 1–3. The suction created inside the chambers 40, 42, 44, 46 by the vacuum source 30 continues to hold the shafts 32, 34, 36, 38 down in their respective chambers so that the retaining arms 12, 14, 16, 18 are secured against the edge of the wafer 20.

Figure 4:
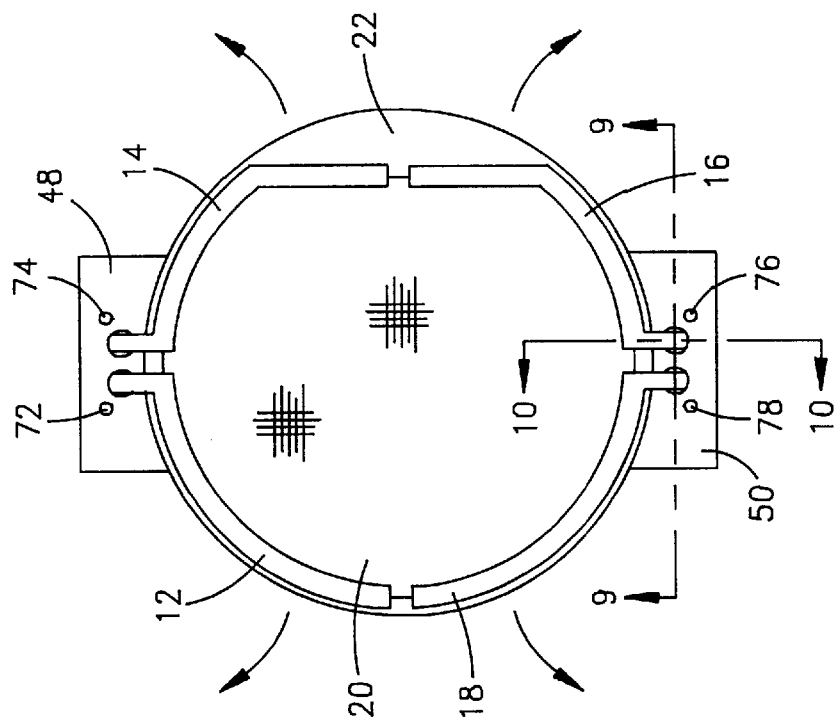
FIG. 4 is a top view illustrating the semiconductor wafer retaining apparatus shown in FIG. 1.

When the vacuum source 30 is turned off there is no longer a suction force inside the chambers 40, 42, 44, 46 to force the shafts 32, 34, 36, 38 down. At this point, a set of springs 58, 60, 62, 64 are used to move the shafts 32, 34, 36, 38 up in a direction out of their respective chambers 40, 42, 44, 46. Specifically, each of the springs 58, 60, 62, 64 is coupled to and surrounds its respective shaft 32, 34, 36, 38 and pushes the respective shaft up to move the retaining arms 12, 14, 16, 18 from the closed position to an open position. FIG. 4 shows the retaining arms 12, 14, 16, 18 in the closed position with arrows indicating the direction in which the retaining arms 12, 14, 16, 18 travel when they are moved to the open position.

Figure 5:
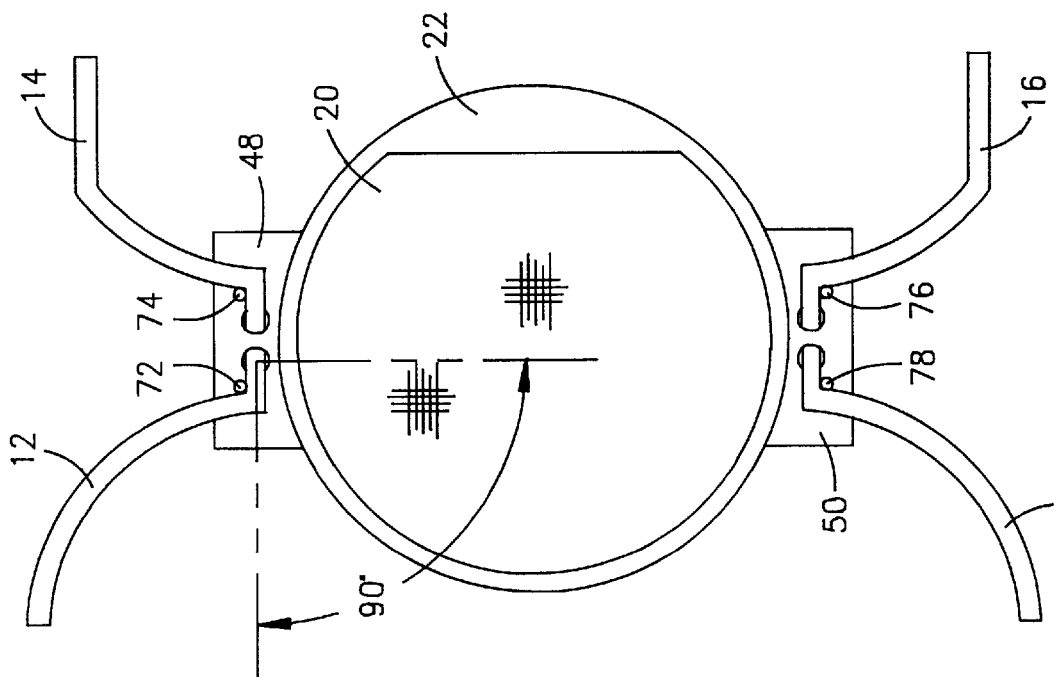
FIG. 5 is a top view illustrating the semiconductor wafer retaining apparatus shown in FIG. 1 in the open position.
Figure 6:
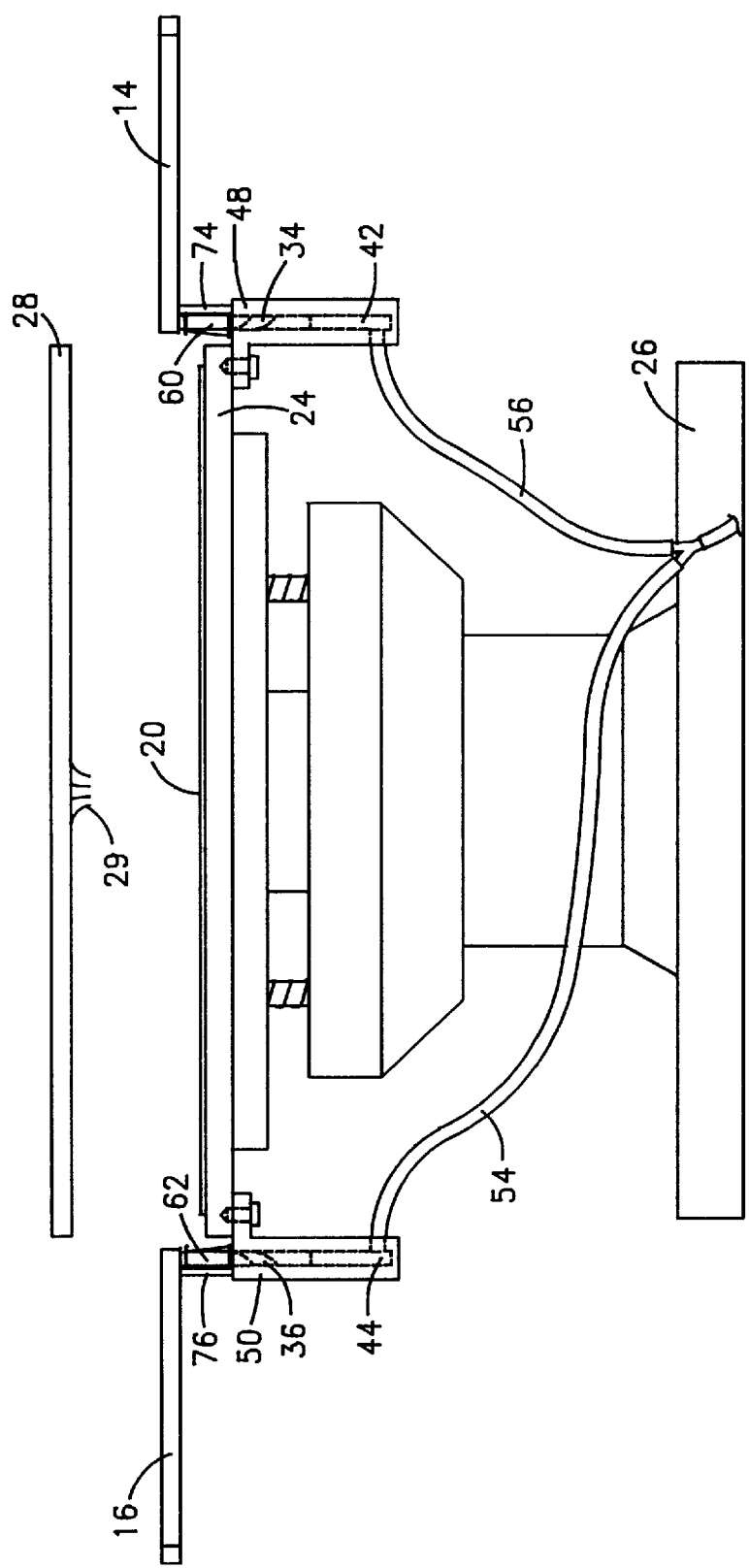
FIG. 6 is a front view illustrating the semiconductor wafer retaining apparatus shown in FIG. 1 in the open position.

FIGS. 5 and 6 show the retaining arms 12, 14, 16, 18 in the open position. As the shafts 32, 34, 36, 38 move up, the retaining arms 12, 14, 16, 18 also move up so that they become spaced apart from the semiconductor wafer 20. In addition, as the shafts 32, 34, 36, 38 move up they also rotate so that the retaining arms 12, 14, 16, 18 rotate out away from the semiconductor wafer 20. Because the retaining arms 12, 14, 16, 18 are moved up and out of the way of the wafer 20, the wafer 20 can be easily removed from the surface 22 of the chuck 24.

Figure 7:
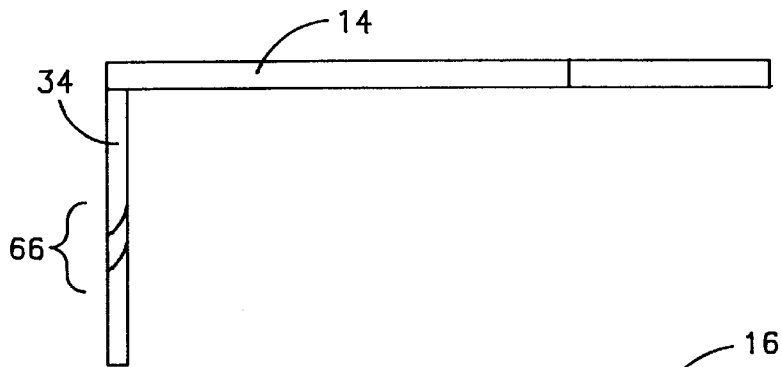
FIGS. 7 and 8 are side views illustrating two of the retaining arms of the semiconductor wafer retaining apparatus shown in FIG. 1.
Figure 8:
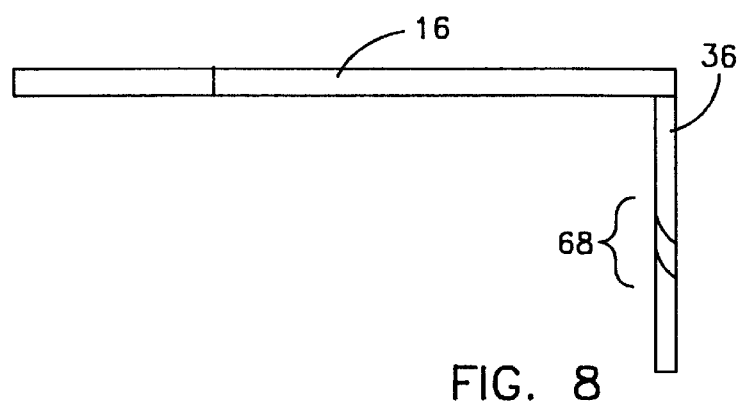

Each of the shafts 32, 34, 36, 38 includes a helical scribe, or thread, therearound in order to cause the shafts to rotate as they move either up or down in their respective chambers 40, 42, 44, 46. Referring to FIG. 7, shaft 34 includes a right hand helical thread 66 so that retaining arm 14 rotates clockwise as shaft 34 moves down and counter clockwise as shaft 34 moves up. Referring to FIG. 8, shaft 36 includes a left hand helical thread 68 so that retaining arm 16 rotates counter clockwise as shaft 36 moves down and clockwise as shaft 36 moves up.

Figure 9:
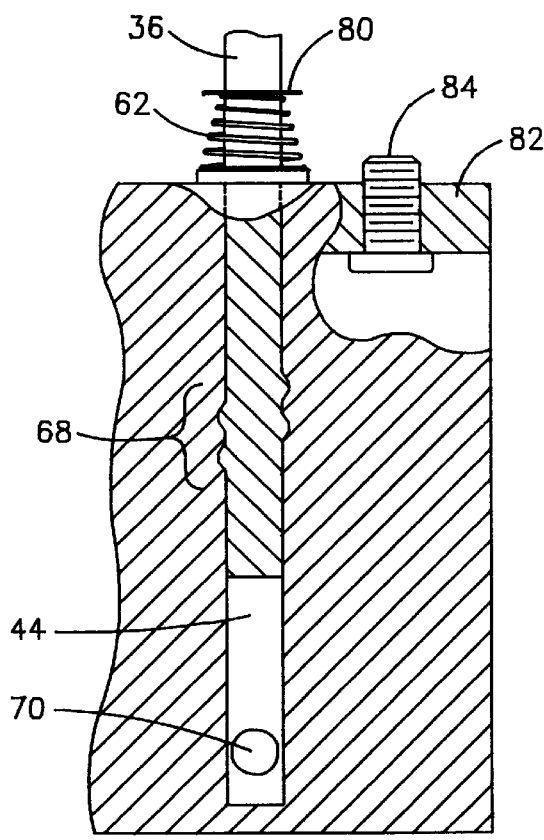
FIG. 9 is a cross-sectional view taken along line 9—9 of FIG. 4.
Figure 10:
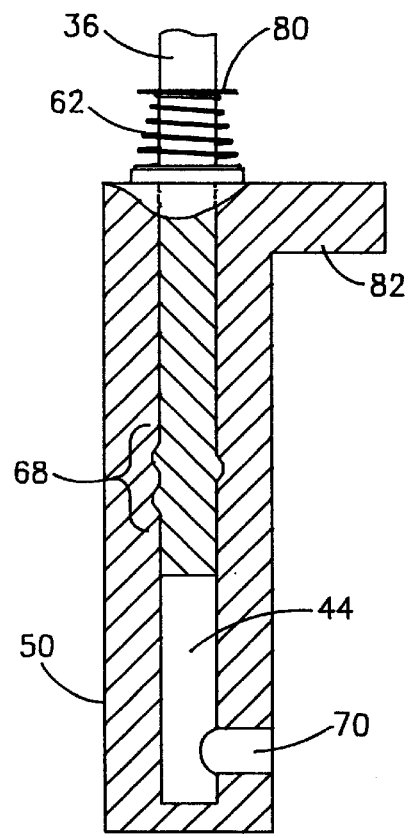
FIG. 10 is a cross-sectional view taken along line 10—10 of FIG. 4.

Referring to FIG. 9, the helical thread 68 formed in shaft 36 engages with a complimentary helical thread formed on the inner surface of chamber 44 in order to facilitate shaft 36 rotating about its lengthwise axis as it moves in a direction collinear with its lengthwise axis within the chamber 44. The helical thread 68 and the complimentary helical thread formed on the inner surface of the chamber 44, as well as the threads on the other shafts 32, 34, 38 and respective chambers 40, 42, 46, may be contoured such that the each shaft 32, 34, 36, 38 rotates about its lengthwise axis approximately 90° and the retaining arms 12, 14, 16, 18 move up a distance approximately equal to one-fourth of an inch from the surface 22 as the springs 58, 60, 62, 64 push the retaining arms 12, 14, 16, 18 from the closed to the open position; similarly, each shaft 32, 34, 36, 38 rotates about its lengthwise axis approximately 90° and the retaining arms 12, 14, 16, 18 move down a distance approximately equal to one-fourth of an inch when the vacuum source 30 pulls the retaining arms 12, 14, 16, 18 from the open to the closed position. The 90° of rotation is illustrated in FIG. 5. Although 90° of rotation and a one-fourth of an inch vertical movement of the retaining arms 12, 14, 16, 18 is preferred, it should be well understood that the retaining arms 12, 14, 16, 18 may rotate and move vertically any amount that causes them to release the semiconductor wafer 20. Such amounts may be greater or less than 90° and greater or less than one-fourth of an inch.

The springs 58, 60, 62, 64 will continue to rotate and pull the shafts 32, 34, 36, 38 in a direction out of the chambers 40, 42, 44, 46 unless they are stopped from doing so. Four mechanical stop posts 72, 74, 76, 78 are used to stop the rotation of the shafts 32, 34, 36, 38 at approximately 90°. Specifically, the stop posts 72, 74 are mounted in the block 48 and are used to stop the retaining arms 12, 14, respectively, from rotating more than 90°. The stop posts 76, 78 are mounted in the block 50 and are used to stop the retaining arms 16, 18, respectively, from rotating more than 90°.

Each of the shafts 32, 34, 36, 38 will normally include a retaining washer, such as the washer 80 on shaft 36, for holding the respective springs 58, 60, 62, 64 in place. Although it is preferred that the springs 58, 60, 62, 64 be located external to their respective chambers 40, 42, 44, 46, it should be well understood that the springs 58, 60, 62, 64 may instead be located internal to the chamber 44 in accordance with the present invention. Furthermore, although a tapered, coil type spring, such as the spring 62 shown in FIG. 9, is preferred, it should be well understood that other types of springs may be used in accordance with the present invention. For example, a non-tapered spring or a safety pin type spring may be connected to each of the shafts 32, 34, 36, 38.

The block 50 includes a lip portion 82 which is used to connect the block 50 to the chuck 24. Specifically, the lip portion 82 may be secured to the underside of the chuck 24 via one or more screws, such as the screw 84. A similar lip portion is also included on the block 48. The block 50 also includes a hole 70 which provides access to the chamber 44. The vacuum hose 54 is connected to the hole 70 to provide the suction force inside the chamber 44. Similar holes are included for the other chambers 40, 42, 46.

When the testing of the semiconductor wafer 20 is complete, the vacuum is released and the springs 58, 60, 62, 64 push the shafts 32, 34, 36, 38 up. Because of the helical scribe in each shaft and the right and left hand threads, the shafts 32, 34, 36, 38 move up and turn to clear the wafer 20, thus freeing the wafer 20 so a wafer transfer system (not shown) can pick up and move the wafer 20 to a storage compartment for finished wafers. Then, an untested wafer is transferred over the transfer system and moved into place on the surface 22 of the chuck 24. The vacuum source 30 applies a vacuum inside the chambers 40, 42, 44, 46 which causes the shafts 32, 34, 36, 38 to move downward and turn (due to the helical scribes) approximately 90° to align the arms with the new wafer. The vacuum holds the shafts down, which in turn, causes the arms to hold the wafer.

Figure 11:
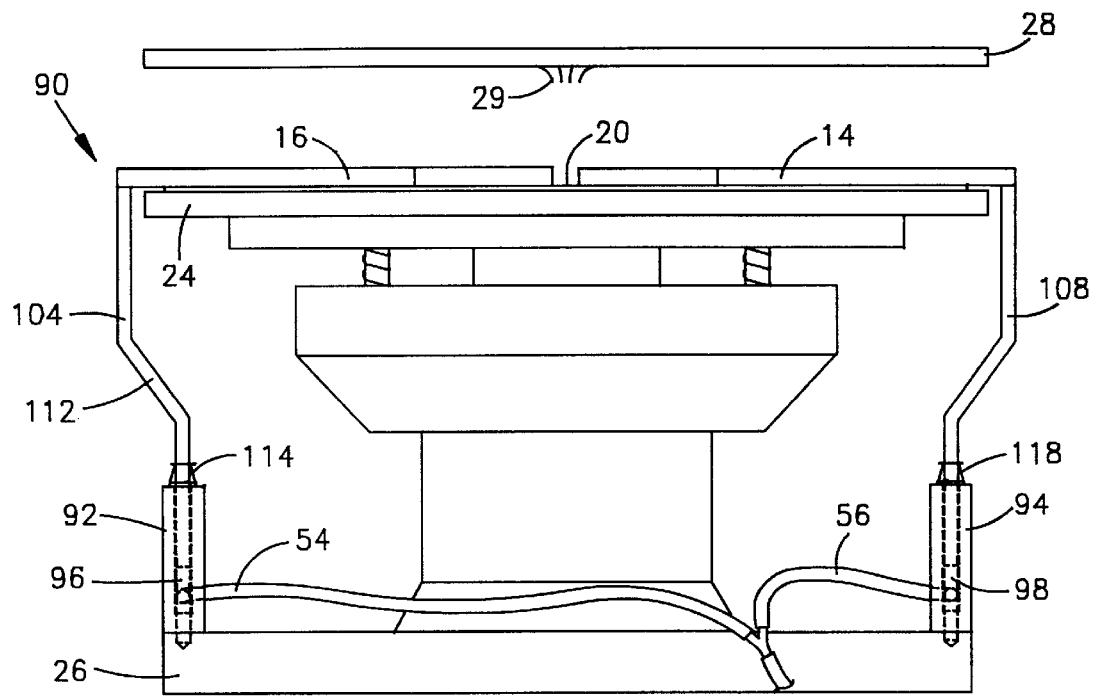
FIGS. 11 and 12 are front and side views, respectively, illustrating another semiconductor wafer retaining apparatus in accordance with the present invention.
Figure 12:
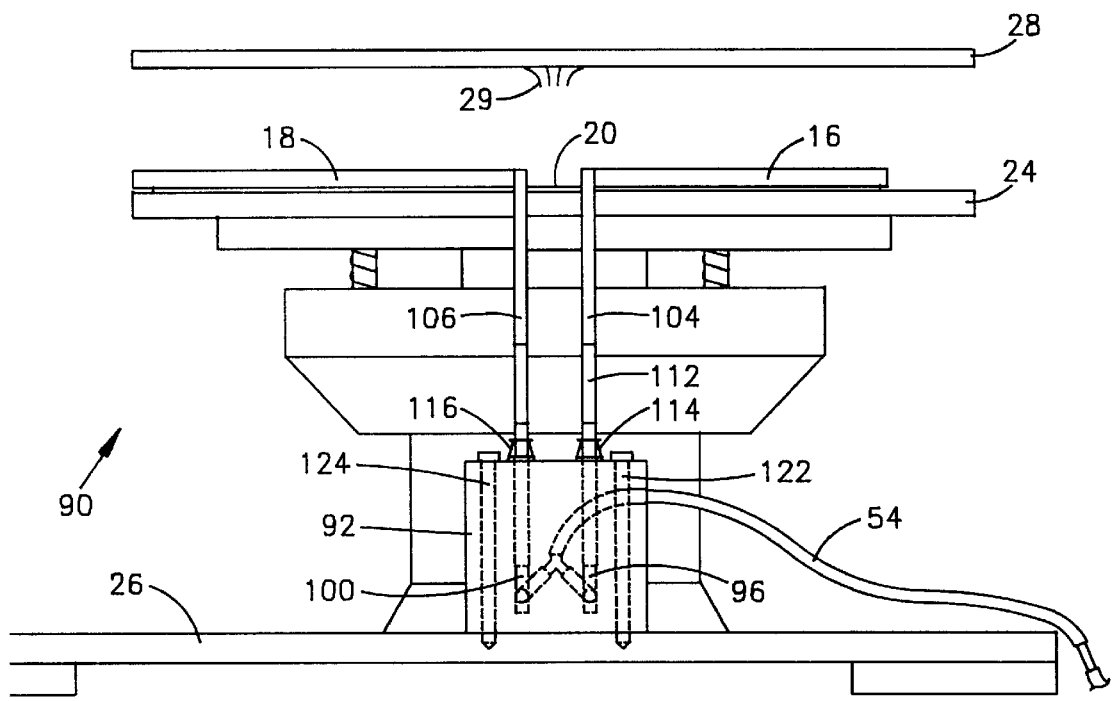

Referring to FIGS. 11 and 12, there is illustrated another retaining apparatus 90 in accordance with the present invention. The retaining apparatus 90 has the blocks 92, 94 mounted on the base 26 rather than the underside of the chuck 24. The block 92 includes chambers 96, 100 and the block 94 includes chambers 98, 102. The shafts 104, 106 are inserted into the chambers 96, 100, and the shafts 108, 110 are inserted into the chambers 98, 102. The shafts 104, 106, 108, 110 are longer than the shafts 32, 34, 36, 38 of the retaining apparatus 10. Furthermore, the shafts 104, 106, 108, 110 include a bent section, such as the bent section 112 of shaft 104, in order for the shafts 104, 106, 108, 110 to come out from under the chuck 24 to connect to their respective retaining arms 16, 18, 14, 12.

Similar to the retaining apparatus 10, vacuum is used to pull the shafts 104, 106, 108, 110 into their respective chambers 96, 100, 98, 102, and a set of springs 114, 116, 118, 120 are used to move the shafts 104, 106, 108, 110 in a direction out of their respective chambers. The blocks 92, 94 may be secured to the base 26 by means of screws, such as screws 122, 124 for the block 92.

The retaining apparatus 10 or 90 can be easily incorporated into a conventional vacuum chuck testing station so that existing hardware can be utilized. In general, the vacuum source which provides vacuum to the conventional vacuum chuck head may be disconnected from the vacuum holes in the chuck surface so that the vacuum holes are not functional. This will permit a conventional vacuum chuck head to be utilized in the retaining apparatus 10 or 90 of the present invention. Mechanical arms, such as the retaining arms 12, 14, 16, 18, will be used to hold a wafer in place during testing but will move out of the way during wafer transfer. The mechanical arms are sufficiently low profile so that they allow the probe needles to contact the wafer surface during the test. The mechanical arms are connected to shafts which each have a helical scribe or thread therearound so that the shafts rotate to turn the mechanical arms out of the way during wafer transfer.

The mechanical arms may be vacuum controlled for retraction, i.e., to move from the open position to the closed position, and spring released, i.e., to move from the closed position to the open position. By using vacuum retraction, the existing vacuum source for the conventional vacuum chuck may be utilized. However, although vacuum retraction is preferred, it should be well understood that other means of retracting the shafts may be utilized. For example, an electromagnetic "relay type" mechanism may be used to pull the shafts deeper into their respective chambers.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An apparatus for retaining a semiconductor wafer on a first surface of a chuck, comprising:
    a first chamber positioned adjacent to the chuck and disposed below the first surface of the chuck;
    a first elongate shaft having a first end positioned above the first surface of the chuck and a second end positioned inside the first chamber;
    a first retainer member connected to the first end of the first shaft which extends over the first surface of the chuck and a portion of the semiconductor wafer resting thereon in order to retain the semiconductor wafer thereagainst when the first retainer member is in a closed position; and
    retraction means for pulling the first shaft deeper into the first chamber so that the first retainer member moves from an open position where it is spaced apart from the semiconductor wafer to the closed position where it contacts the portion of the semiconductor wafer.

2. An apparatus in accordance with claim 1, wherein the first shaft includes a helical thread formed therearound which engages with a complementary helical thread formed on an inner surface of the first chamber so that the first shaft rotates about its lengthwise axis as the retraction means pulls it in a direction collinear with its lengthwise axis.

3. An apparatus in accordance with claim 2, wherein the helical thread formed around the first shaft and the complementary helical thread formed on the inner surface of the first chamber are contoured such that the first shaft rotates about its lengthwise axis 90 degrees as the retraction means pulls it from the open position to the closed position.

4. An apparatus in accordance with claim 1, wherein the retraction means comprises:
    a vacuum source coupled to the first chamber to provide suction inside the first chamber to pull the first shaft deeper into the first chamber so that the first retainer member moves from the open position to the closed position.

5. An apparatus in accordance with claim 1, further comprising:
    protraction means for moving the first shaft further out of the first chamber so that the first retainer member moves from the closed position to the open position.

6. An apparatus in accordance with claim 5, wherein the protraction means comprises a spring coupled to the first shaft.

7. An apparatus in accordance with claim 6, wherein the spring is positioned outside of the first chamber and surrounds a portion of the first shaft.

8. An apparatus for retaining a semiconductor wafer on a first surface of a chuck, comprising:
    a first chamber positioned adjacent to the chuck and disposed below the first surface of the chuck;
    a first elongate shaft having a first end positioned above the first surface of the chuck and a second end positioned inside the first chamber;
    a first retainer member connected to the first end of the first shaft and which extends over the first surface of the chuck and a portion of the semiconductor wafer resting thereon in order to retain the semiconductor wafer thereagainst when the first retainer member is in a closed position; and
    a vacuum source coupled to the first chamber to provide suction inside the first chamber to pull the first shaft deeper into the first chamber so that the first retainer member moves from an open position where it is spaced apart from the semiconductor wafer to the closed position where it contacts the portion of the semiconductor wafer.

9. An apparatus in accordance with claim 8, wherein the first shaft includes a helical thread formed therearound which engages with a complementary helical thread formed on an inner surface of the first chamber so that the first shaft rotates about its lengthwise axis as the vacuum source pulls it in a direction collinear with its lengthwise axis.

10. An apparatus in accordance with claim 9, wherein the helical thread formed around the first shaft and the complementary helical thread formed on the inner surface of the first chamber are contoured such that the first shaft rotates about its lengthwise axis 90 degrees as the vacuum source pulls it from the open position to the closed position.

11. An apparatus in accordance with claim 8, further comprising:
    a spring coupled to the first shaft which moves the first shaft further out of the first chamber so that the first retainer member moves from the closed position to the open position.

12. An apparatus in accordance with claim 11, wherein the spring is positioned outside the first chamber and surrounds a portion of the first shaft.

13. An apparatus for retaining a semiconductor wafer on a first surface of a chuck, comprising:

first and second chambers positioned adjacent to a perimeter of the chuck and disposed below the first surface of the chuck;

first and second elongate shafts each having a first end positioned above the first surface of the chuck and a second end positioned inside the first and second chambers, respectively;

first and second retainer members connected to the first ends of the first and second shafts, respectively, which extend over the first surface of the chuck and portions of the semiconductor wafer resting thereon in order to retain the semiconductor wafer thereagainst when the first and second retainer members are in a closed position; and a vacuum source coupled to the first and second chambers to provide suction inside the first and second chambers to pull the first and second shafts deeper into their respective chambers so that the first and second retainer members move from an open position where they are spaced apart from the semiconductor wafer to the closed position where they contact portions of the semiconductor wafer.

14. An apparatus in accordance with claim 13, wherein the first and second shafts each include a helical thread formed therearound which engages with a complementary helical thread formed on an inner surface of the first and second chambers, respectively, so that the first and second shafts rotate about their lengthwise axis as the vacuum source pulls them in a direction collinear with their lengthwise axes.

15. An apparatus in accordance with claim 14, wherein the helical threads formed around the first and second shafts and the complementary helical threads formed on the inner surface of the first and second chambers are contoured such that each of the first and second shafts rotate about their lengthwise axis 90 degrees as the vacuum source pulls them from the open position to the closed position.

16. An apparatus in accordance with claim 13, further comprising:

first and second springs coupled to the first and second shafts, respectively, which move the first and second shafts further out of their respective chambers so that the first and second retainer members move from the closed position to the open position.

17. An apparatus in accordance with claim 16, wherein the first and second springs are positioned outside the first and second chambers, respectively, and each surround a portion of the first and second shafts, respectively.

18. An apparatus in accordance with claim 13, wherein the first and second chambers are both located on one side of a diameter of the first surface of the chuck.

19. An apparatus in accordance with claim 13, wherein the first and second chambers are located on opposite sides of a diameter of the first surface of the chuck.

20. A retaining apparatus for retaining a semiconductor wafer on a first surface of a chuck, comprising:

first, second, third and fourth elongate shafts each positioned adjacent to a perimeter of the first surface of the chuck and so that a lengthwise axis of each shaft is substantially perpendicular to the first surface of the chuck, the first and second shafts being located on one side of a diameter of the first surface of the chuck and the second and third shafts being located on another side of the diameter of the first surface of the chuck;

first, second, third and fourth retainer members each connected to a first end of the first, second, third and fourth shafts, respectively, the retainer members extending over the first surface of the chuck and portions of the semiconductor wafer resting thereon in order to retain the semiconductor wafer thereagainst when the retainer members are in a closed position;

first, second, third and fourth chambers which each receive a second end of the first, second, third and fourth shafts, respectively; and a vacuum source coupled to the first, second, third and fourth chambers to provide suction inside the chambers to pull the first, second, third and fourth shafts deeper into their respective chambers so that the retainer members move from an open position where they are spaced apart from the semiconductor wafer to the closed position where they contact portions of the semiconductor wafer.

21. An apparatus in accordance with claim 20, wherein the first, second, third and fourth shafts each include a helical thread formed therearound which engages with a complementary helical thread formed on an inner surface of the first, second, third and fourth chambers, respectively, so that each of the shafts rotates about its lengthwise axis as the vacuum source pulls them in a direction collinear with their lengthwise axes.

22. An apparatus in accordance with claim 21, wherein the helical threads formed around the first, second, third and fourth shafts and the complementary helical threads formed on the inner surface of the first, second, third and fourth chambers are contoured such that each of the shafts rotates about its lengthwise axis 90 degrees as the vacuum source pulls them from the open position to the closed position.

23. An apparatus in accordance with claim 20, further comprising:

first, second, third and fourth springs coupled to the first, second, third and fourth shafts, respectively, which move the first, second, third and fourth shafts further out of their respective chambers so that the first, second, third and fourth retainer members move from the closed position to the open position.

24. An apparatus in accordance with claim 23, wherein the first, second, third and fourth springs are positioned outside the first, second, third and fourth chambers, respectively, and each surrounds a portion of its respective shaft.

25. A semiconductor wafer test station, comprising:

a base;

a chuck mounted on the base, the chuck having a substantially planar first surface for receiving a wafer;

a first block having a first chamber formed therein, the first block being positioned adjacent to the chuck and disposed below the first surface of the chuck;

a first elongate shaft which extends into the first chamber and that is positioned so that its lengthwise axis is substantially perpendicular to the first surface of the chuck, the first shaft having a helical thread therearound which engages with a complementary helical thread formed on an inner surface of the first chamber so that the first shaft rotates about its lengthwise axis as it moves within the first chamber in a direction collinear with its lengthwise axis;

a first retainer member connected to the first shaft at a point such that the first retainer member extends over the first surface of the chuck to sandwich a portion of the wafer therebetween when the first retainer member is in a closed position; and a vacuum source coupled to the first chamber to provide suction inside the first chamber to pull the first shaft deeper into the first chamber so that the first retainer member moves from an open position where it is spaced apart from the first surface of the chuck to the closed position where it contacts a portion of the wafer, the first shaft rotating about its lengthwise axis as it moves from the open position to the closed position.

26. An apparatus in accordance with claim 25, wherein the helical thread formed around the first shaft and the complementary helical thread formed on the inner surface of the first chamber are contoured such that the first shaft rotates about its lengthwise axis 90 degrees as the vacuum source pulls it from open position to the closed position.

27. A semiconductor wafer test station in accordance with claim 25, further comprising:

a second block having a second chamber formed therein, the second block being positioned adjacent to the chuck and disposed below the first surface of the chuck;

a second elongate shaft which extends into the second chamber, the second shaft being positioned so that its lengthwise axis is substantially perpendicular to the first surface of the chuck, the second shaft having a helical thread therearound which engages with a complementary helical thread formed on an inner surface of the second chamber so that the second shaft rotates about its lengthwise axis as it moves within the second chamber in a direction collinear with its lengthwise axis; and a second retainer member connected to the second shaft at a point such that the second retainer member extends over the first surface of the chuck to sandwich a portion of the wafer therebetween when the second retainer member is in a closed position;

wherein, the vacuum source is coupled to the second chamber to provide suction inside the second chamber to pull the second shaft deeper into the second chamber so that the second retainer member moves from an open position where it is spaced apart from the first surface of the chuck to the closed position where it contacts a portion of the wafer, the second shaft rotating about its lengthwise axis as it moves from the open position to the closed position.

28. A semiconductor wafer test station in accordance with claim 27, wherein, the first and second elongate shafts are both located on one side of a diameter of the first surface of the chuck.

29. A method of retaining a semiconductor wafer on a first surface of a chuck, comprising the steps of:

creating a vacuum inside of a first chamber which is positioned adjacent to the chuck and disposed below the first surface of the chuck;

using the vacuum created inside of the first chamber to pull a first elongate shaft deeper into the first chamber, the first elongate shaft being positioned substantially perpendicular to the first surface of the chuck and having a first end which extends thereabove; and rotating the first shaft about its lengthwise axis as it is pulled deeper into the first chamber so that a first retainer member connected to the first end of the first shaft rotates from an open position where it does not extend over the first surface of the chuck to a closed position where it does extend over the first surface of the chuck.

30. A method in accordance with claim 29, wherein the rotating step comprises the step of:

engaging a helical thread formed around the first shaft with a complementary helical thread formed on an inner surface of the first chamber.

31. A method in accordance with claim 30, wherein the helical thread formed around the first shaft and the complementary helical thread formed on the inner surface of the first chamber are contoured such that the first shaft rotates about its lengthwise axis 90 degrees as it is pulled from the open position to the closed position.

32. A method in accordance with claim 29, further comprising the step of:

moving the first shaft further out of the first chamber so that the first retainer member moves from the closed position to the open position.

33. A method in accordance with claim 32, wherein the step of moving the first shaft further out of the first chamber comprises the step of:

moving the first shaft with a force provided by a spring.

34. A method of testing a semiconductor wafer, comprising the steps of:

placing the semiconductor wafer on a first surface of a chuck;

creating a vacuum inside of a first chamber which is positioned adjacent to the chuck and disposed below the first surface of the chuck;

using the vacuum created inside of the first chamber to pull a first elongate shaft deeper into the first chamber, the first elongate shaft being positioned substantially perpendicular to the first surface of the chuck and having a first end which extends thereabove;

rotating the first shaft about its lengthwise axis in a first direction as it is pulled deeper into the first chamber so that a first retainer member connected to the first end of the first shaft rotates from an open position where it does not extend over the first surface of the chuck to a closed position where it extends over the first surface of the chuck and contacts a portion of the semiconductor wafer to retain it on the first surface of the chuck;

probing the semiconductor wafer with a testing apparatus; and moving the first shaft further out of the first chamber so that the first retainer member moves from the closed position to the open position.

35. A method in accordance with claim 34, wherein the rotating step comprises the step of:

engaging a helical thread formed around the first shaft with a complementary helical thread formed on an inner surface of the first chamber.

36. A method in accordance with claim 35, wherein the helical thread formed around the first shaft and the complementary helical thread formed on the inner surface of the first chamber are contoured such that the first shaft rotates about its lengthwise axis 90 degrees as it is pulled from the open position to the closed position.

37. A method in accordance with claim 34, wherein the step of moving the first shaft further out of the first chamber comprises the step of:

releasing the vacuum created inside of the first chamber.

38. A method in accordance with claim 34, wherein the step of moving the first shaft further out of the first chamber comprises the step of:

moving the first shaft with a force provided by a spring.

* * * * *

UNITED STATES PATENT AND TRADEMARK OFFICE
CERTIFICATE OF CORRECTION

PATENT NO. : 5,883,522
DATED : March 16, 1999
INVENTOR(S) : John O. O'Boyle

It is certified that error appears in the above-identified patent and that said Letters Patent is hereby corrected as shown below:

In Col. 9, line 32, delete ":".

In Col. 11, line 17, after "from" insert --the--.

Signed and Sealed this

Sixth Day of July, 1999

Attest:

Attesting Officer

Q. TODD DICKINSON

Acting Commissioner of Patents and Trademarks